United States Patent
Yang et al.

(10) Patent No.: US 7,602,457 B2
(45) Date of Patent: Oct. 13, 2009

(54) CIRCUIT AND A DISPLAY USING SAME

(75) Inventors: Zhao-Tang Yang, Taipei (TW);
Chiao-Chung Huang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/412,539

(22) Filed: Mar. 27, 2009

(65) Prior Publication Data

US 2009/0180046 A1    Jul. 16, 2009

Related U.S. Application Data

(63) Continuation of application No. 11/486,025, filed on Jul. 14, 2006, now Pat. No. 7,528,897.

(30) Foreign Application Priority Data

Feb. 17, 2006    (TW) ............................. 95105433 A

(51) Int. Cl.
*G02F 1/1333* (2006.01)
*G02F 1/1343* (2006.01)

(52) U.S. Cl. ......................................... 349/55; 349/54

(58) Field of Classification Search .................. 349/54, 349/55, 149–152
See application file for complete search history.

(56) References Cited

U.S. PATENT DOCUMENTS

| | | | |
|---|---|---|---|
| 6,392,719 B2 | 5/2002 | Kim | |
| 7,288,955 B2 * | 10/2007 | Jeon | ............................ 324/770 |
| 7,504,848 B2 * | 3/2009 | Jeon | ............................ 324/770 |
| 2003/0117536 A1 | 6/2003 | Jeon | |
| 2008/0278648 A1 | 11/2008 | Chang | |

FOREIGN PATENT DOCUMENTS

TW    I226671    10/1992

* cited by examiner

*Primary Examiner*—Kevin S Wood
(74) *Attorney, Agent, or Firm*—Birch, Stewart, Kolasch & Birch, LLP

(57) ABSTRACT

A circuit of a display comprises a substrate, at least one thin film transistor, at least one first wire and at least one second wire formed on the substrate. The substrate has an active area and a bonding area. The thin film transistor is disposed in the active area. The first wire is disposed in the bonding area. The second wire includes a first end electrically connected to the first wire, a second end electrically connected to the thin film transistor, an overlap portion overlapping the first wire, and a sacrificing portion between the first end and the second end.

14 Claims, 4 Drawing Sheets

CIRCUIT AND A DISPLAY USING SAME

This application is a Continuation of application Ser. No. 11/486,025, filed on Jul. 14, 2006, now U.S. Pat. No. 7,528,897, the entire contents of which are hereby incorporated by reference and for which priority is claimed under 35 U.S.C. § 120 and which claims priority under 35 U.S.C. § 119(a) of Taiwan Patent Application Serial No. 095105433, filed Feb. 17, 2006, the entire contents of which is incorporated herein by reference.

BACKGROUND OF THE INVENTION (1) Field of the Invention

The present invention relates to a circuit of a display, particularly to a circuit used to test or to repair the display.

(2) Description of the Related Art

A pixel array of an active display comprises a plurality of scan lines and data lines cross with each other. Each pixel unit of the pixel array employs a thin film transistor as switch. The source electrode and gate electrode of the thin film transistor are electrically connected to the data line and scan line, respectively. When the data line or the scan line is broken, the signal cannot feed through the broken point so the image quality is worse. That is why a rescue line is employed by a display.

Referring to FIG. 1, the display 100 includes an active area 110 and a bonding area 120 on the lower substrate 101. The bonding area 120 is located at the peripheral portion of the active area 110. A sealant 130 is applied between the active area 110 and the bonding area 120 or at the peripheral portion of the active area 110 to adhere the lower substrate 101 to the upper substrate (not shown). The active area 110 is disposed with a plurality of scan lines 112, data lines 114 and thin film transistors 115. The bonding area 120 is disposed with a data driver 128 electrically connected to the data line 114, and with a scan driver 129 electrically connected to the scan line 112. Three shorting bars 122, 124, 126 disposed at one side of the bonding area 120 are electrically connected to the red, blue, green pixels and the test device (not shown) to find the defect. After testing, the shorting bars 122, 124 and 126 are cut along C-C line by laser.

In the prior art, the rescue line 116 encloses the active area 110 alone inner side of the sealant 130, but does not connect to the shorting bars 122, 124 and 126. The repairing by the rescue line 116 is described as follows. In the normal state, the rescue line 116 overlaps but electrically insulated from the data line 114 or the scan lines 112 via an insulating layer (not shown). If the data line 114 has a broken point 117, then the data driver 128 cannot transmit the data signal into the pixel unit 102 through the path A. Under the circumstances, the insulating layer of the welding point 103a and 103b is welded for conducting the rescue line 116 with the data line 114. Therefore, the data signal can transmit along the path B, that is, the signal goes to the welding point 103a, and then turn to the rescue line 116, subsequently, it goes to the welding point 103b, and is input to the thin film transistor 115 of the pixel unit 102 through the other end of the data line 114.

However, if a break point 118 is generated in the region 140 which is located outside the rescue line 116, the rescue line 116 will be out of action because the data signal cannot be transmitted into the rescue line 116. The reasons are as following:

1. Currently the rescue line 116 is disposed inside the sealant 130, so the defects, such as pad burn or lead scratch etc., occurring in the region 140 outside the rescue line 116 cannot be repaired. That causes that the display products, such as TV, are frequently discarded in the latter manufacturing process or in client end.

2. The rescue line 116 is separated from the test lines 122, 124 and 126 to reduce the utilization ratio of the substrate.

SUMMARY OF THE INVENTION

The object of the present invention is to provide a circuit of a display, which combines a rescue line with a test line to reduce the failure of the display and to increase the utilization ratio of the substrate.

In one aspect of the present invention, the circuit of a display comprises a substrate, at least one thin film transistor, at least one first wire and at least one second wire formed on the substrate. The substrate has an active area and a bonding area. The thin film transistor is disposed in the active area. The first wire is disposed in the bonding area. The second wire includes a first end electrically connected to the first wire, a second end electrically connected to the thin film transistor, an overlap portion overlapping the first wire, and a sacrificing portion between the first end and the second end.

The overlap portion can be welded selectively and the sacrificing portion can be cut selectively. If the overlap portion has been not welded and the sacrificing portion has been not cut yet, the circuit could use to test the display for finding defects. After testing, the sacrificing portion is cut. If the wire of the display is failure, the overlap portion will be welded, at that time, the circuit structure is served as a rescue line.

The present invention can save the arranged area of the rescue line, and change a non repair area into a repair area. Besides, the failure can be reduced due to less pad burn or lead scratch in TV products.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
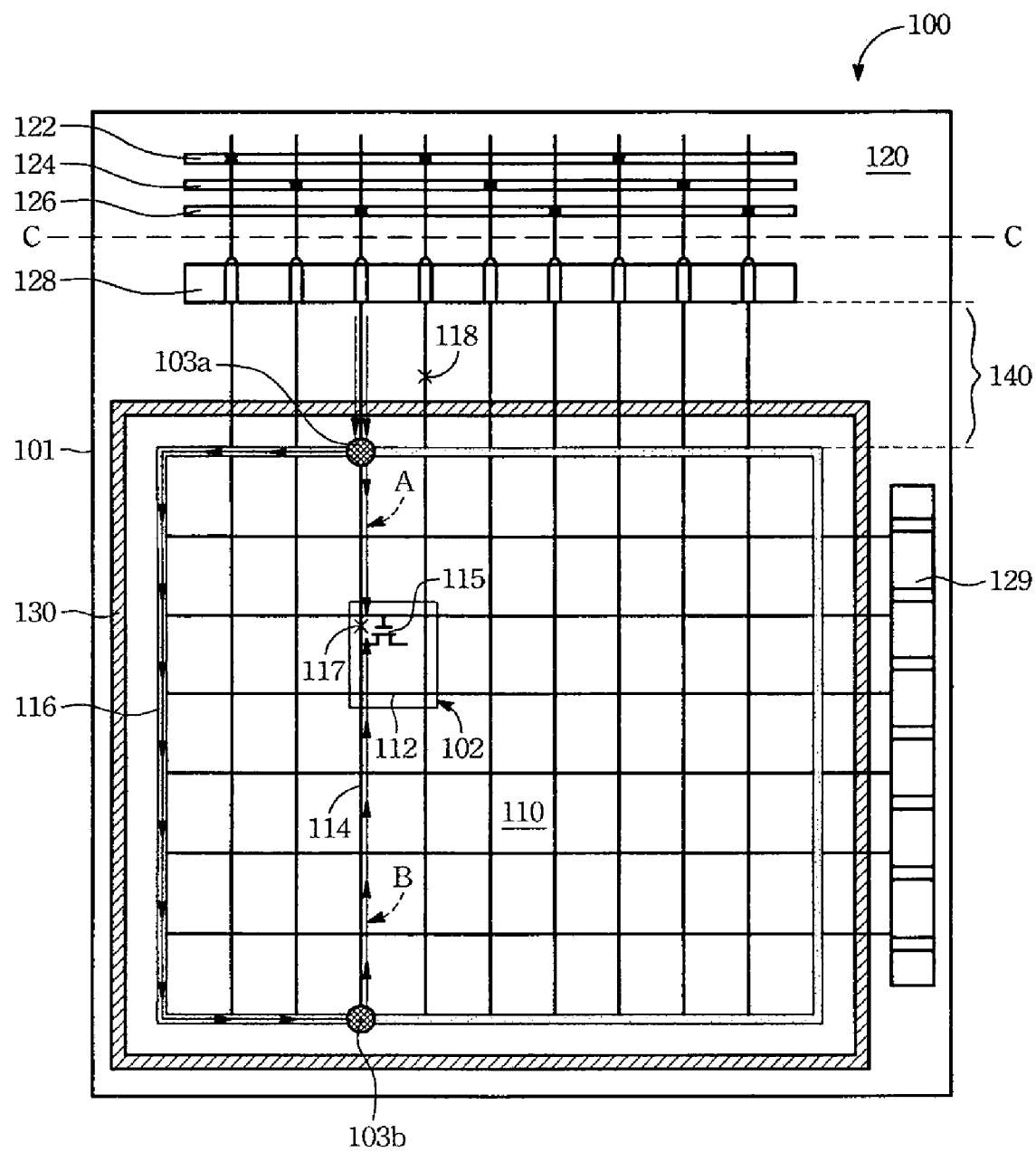
FIG. 1 shows a plane diagram of a circuit with a rescue line in a display according to the prior art.
Figure 2:
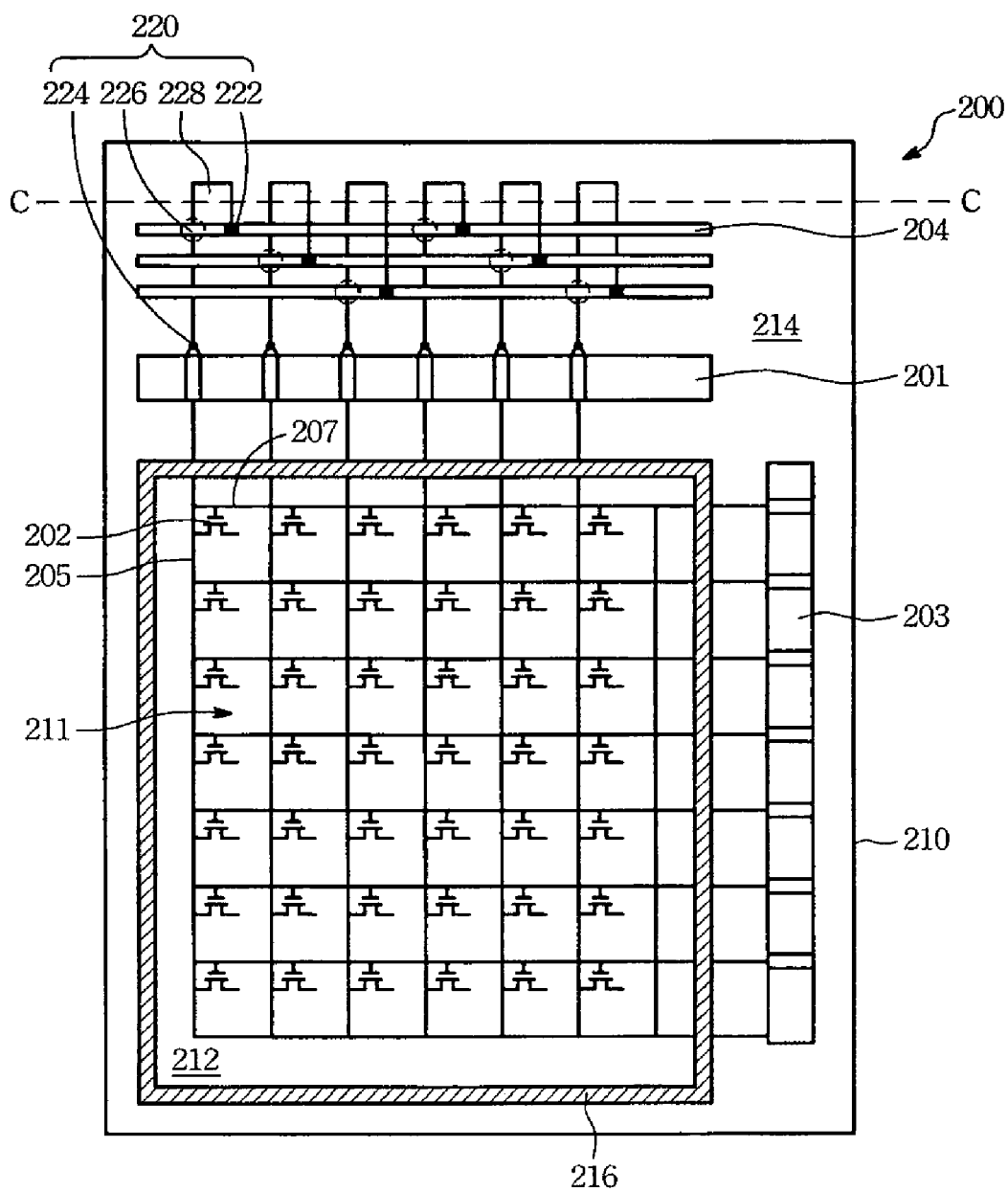
FIG. 2 shows a circuit structure applied to a display according to the present invention.

Referring to FIG. 2, the display 200 includes a substrate 210 divided into an active area 212 and a bonding area 214. A pixel array 211 is disposed in the active area 212 and is covered by an upper lid (not shown) and a color filter (not shown). The sealant 216 encloses the active area 212 for adhering the substrate 210 to the upper lid or the color filter. A data driver 201, a scan driver 203, at least one first wire 204 and at least one second wire 220 are disposed in the bonding area 214. The first wire 204 is electrically connected to the test device (not shown).

The pixel array 211 includes a plurality of thin film transistors 202. Each of the thin film transistors 202 is disposed on the substrate in the active area 212 and electrically connected to the data driver 201 through the data line 205, and electrically connected to the scan driver 203 through the scan line 207. It is noted that the second wire 220 has one end 222 electrically connected to the first wire 204, and the other one end 224 electrically connected to the thin film transistor 202 through the data driver 201. An overlap portion 226 and a sacrificing portion 228 are disposed between two ends 222 and 224. The overlap portion 226 overlaps the first wire 204. The sacrificing portion 228 is a predetermined region of the substrate for cutting along the C-C line.

Preferably, the sacrificing portion 228 is located between the overlap portion 226 and the end 222. The overlap portion 226 is electrically connected to the first wire 204. The sacrificing portion 228 cooperates with the first wire 204 to form a ring structure.

Figure 3:
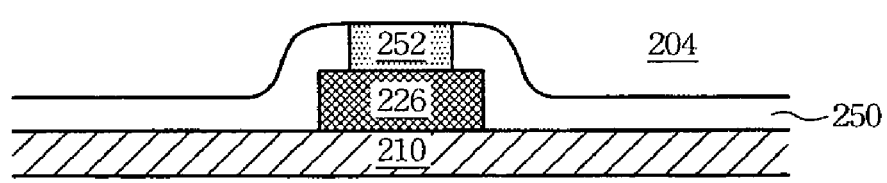
FIG. 3 shows a sectional view of the overlap portion in the circuit structure according to the present invention.

Referring to FIG. 3, the insulating layer 250 includes a contact hole 252 disposed between the overlap portion 226 and the first wire 204. When the contact hole 252 is welded by a laser, the first wire 204 is electrically connected to the second wire 220. The contact hole 252 can be made from the metal or conductive materials. The insulating layer 250 is made of silicon nitride (SiNx), gate silicon nitride (g-SiNx), amorphous silicon (a-Si) or etching stopper silicon nitride (ES-SiNx). By the way, there is no limitation about the relative position between overlap portion 226 and the first wire 204 in the present invention. In other words, the first wire 204 can be also disposed below the second wire 226.

In testing process of the display 200, the first wire 204 and the second wire 220 can act as test lines. When the data line 205 or the scan line 207 is failed, the first and second wires 204 and 220 can act as rescue lines. Two embodiments are provided as follows.

Figure 4:
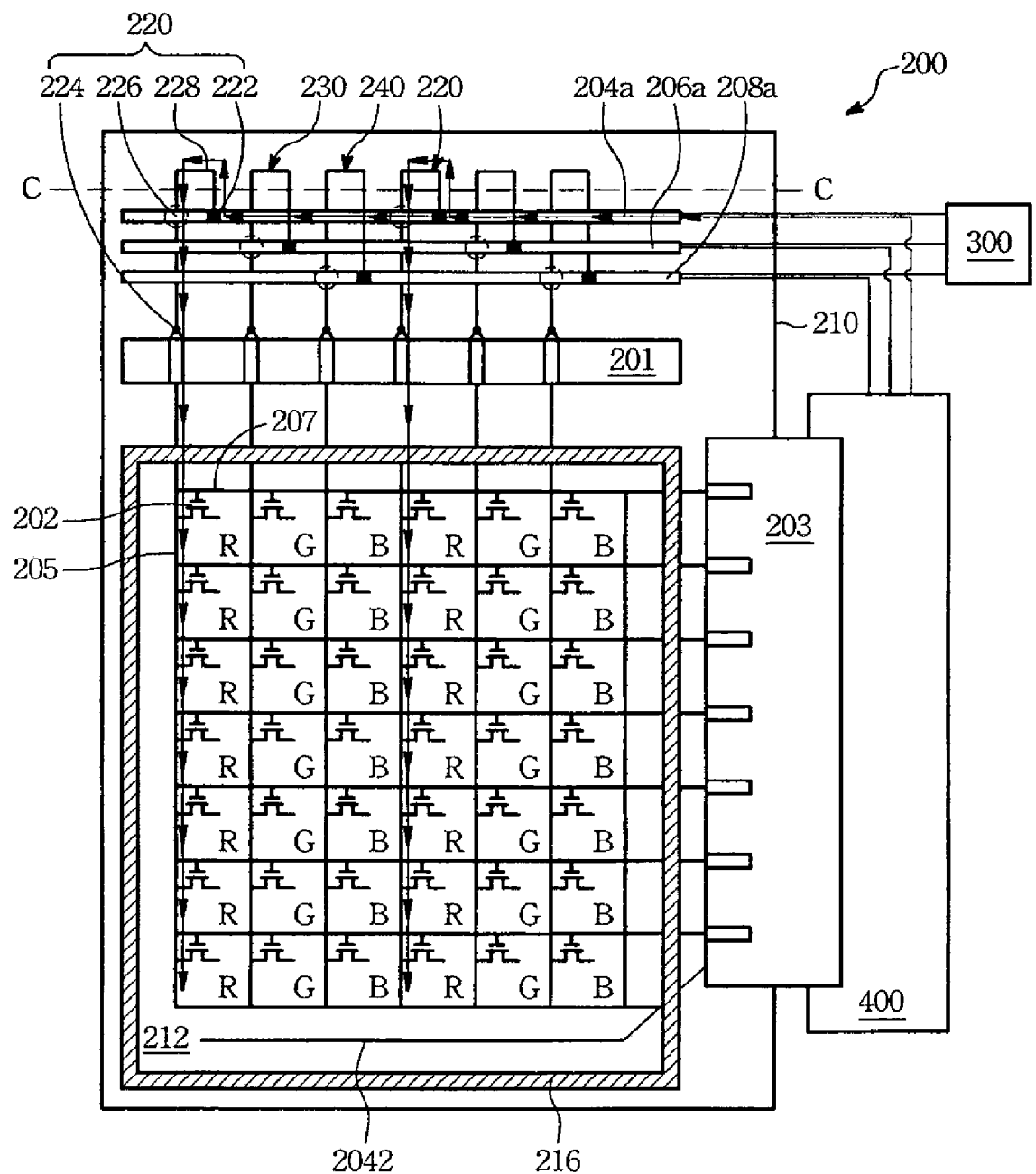
FIG. 4 illustrates a testing process of the display according to the present invention.

Referring to FIG. 4, three first wires 204a, 206a and 208a are disposed in the bonding area of the substrate 210 and electrically connected to a test device 300, which is formed as a multi-jump control circuit (MJC), to test the red pixels R, green pixels G and blue pixels B of the display 200.

The first wire 204a is electrically connected to a plurality of second wires 220, and then electrically connected to all red pixels R of the display 200. Likewise, the first wire 206a is electrically connected to a plurality of second wires 230. By way of the second wires 230, the first wire 206a can be electrically connected to all green pixels G of the display 200. The first wire 208a is electrically connected to a plurality of second wires 240. By way of the second wires 240, the first wire 208a is electrically connected to all blue pixels B of the display 200.

For convenience, the first wire 204a electrically connected to the red pixel R is referred to as "first red wire 204a", and the second wire 220 electrically connected to the red pixel R is referred to as "second red wire 220". Following the analogy of this, the first wire 206a electrically connected to the green pixel G is referred to as "first green wire 206a". The first wire 208a electrically connected to the blue pixel B is referred to as "first blue wire 208a". The second wires 230 and 240 are referred to as "the second blue wire 230" and "the second green wire 240".

The process for testing the red pixels R is described as follows. Before testing, the sacrificing portion cannot be cut, and the overlap portion 226 is electrically insulated from the first red wire 204a, the sectional view is shown in FIG. 3. It is unnecessary to limit the relative position between the overlap portion 226 and the first wire 204a. In other words, the first wire 204a can be disposed below the second wire 220. The insulated layer (not numbered) without contact hole 252 is disposed between the first wire 204a and the overlap 226. When starting to test, the first wire 204a is electrically connected to the test device 300.

The method for testing circuit is described as follows. The test device 300 provides a test signal to the first red wire 204a. And then the test signal is transmitted to the thin film transistors 202 of all the red pixel R through the second red wire 220. As arrows, the detail pathway is that test signal is transmitted to the thin film transistor 202 by way of the test device 300, the first wire 204a, the end 222 of the second wire 220, the sacrificing portion 228, the overlap portion 226, the other end 224 of the second red wire 220, the data driver 201. Likewise, the test device 300 just provides test signals to the first wire 206a and 208a, so that the green pixels G and blue pixels B can be tested by the same way.

Besides connecting to the test device 300, the first red wire 204a, the first green wire 206a and the first blue wire 208a are also electrically connected to a printed circuit board 400 for repairing.

Figure 5:
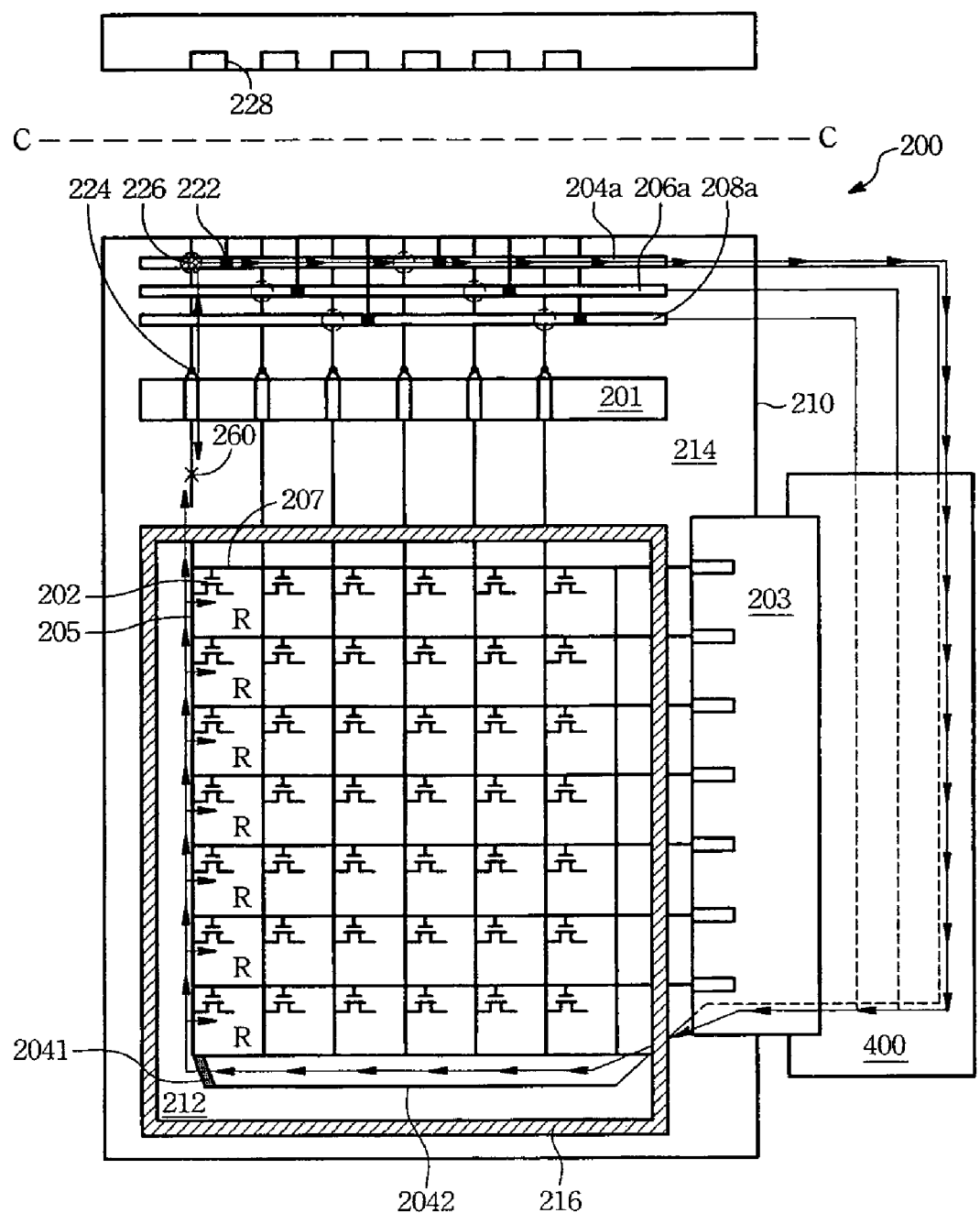
FIG. 5 shows a sketch diagram illustrating how to repair the display according to the present invention.

Referring to FIG. 5, the substrate 210 is structured under two sections for illustration. After testing the display 200, the sacrificing portion 228 has been cut by laser. The first red wire 204a, the first green wire 206a and the first blue wire 208a are electrically connected to the printed circuit board 400, and then electrically connected to the auxiliary line 2042 in the active area 212. When the data line 205 is failed, such as broken point 260, data signals cannot be input to the column of red pixels R along the data line 205. Under the circumstances, the contact hole (not numbered) can be welded so that the data signals can be input to the column of red pixels R by way of the second red wire 220, first wire red wire 204a, the print circuit board 400, the auxiliary line 2042, the welding point 2041 in sequence.

A point worth emphasizing, the present invention can be also applied to repair the failure occurs in the region between the active area 212 and the data driver 201. Besides, it makes the rescue line cover less area of the active area 212.

The present invention can be applied to repair the data lines or the scan lines. The arrangement of the pixel units is not limited to what shown in the figures. The first wire can be a shorting bar. The second wire can be a hook-type wire. The data driver 201 or the scan driver 203 can be packaged to a flexible board with chip-on-film (COF) or tape automated bonding (TAB). The printed circuit board can be replaced with an external circuit. It is means that the first wire is electrically connected to the external circuit, and then the external circuit is electrically connected to the thin film transistor with COF or TAB to form a whole repair cycle.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A circuit for use in a display, comprising:
    a substrate having an active area and a bonding area;
    at least one thin film transistor disposed on the substrate and in the active area;
    at least one first wire disposed on the substrate and in the bonding area; and
    at least one broken second wire including:
        a first end electrically connected to the first wire;
        a second end electrically connected to the thin film transistor;
        an overlap portion overlapping the first wire; and
        a break located between the first end and the overlap portion so that the first end and the second end are not electrically connected.

2. The circuit of claim 1, wherein the first wire is electrically connected to an external circuit.

3. The circuit of claim 1, wherein the overlap portion is electrically insulated from the first wire.

4. The circuit of claim 1, wherein the overlap portion is electrically connected to the first wire.

5. The circuit of claim 1, further comprising an insulating layer disposed between the overlap portion and the first wire, wherein the insulating layer is comprised of silicon nitride, gate silicon nitride, amorphous silicon, or etching stopper silicon nitride.

6. The circuit of claim 1, further comprising an insulating layer disposed between the overlap portion and the first wire, wherein the insulating layer has a contact hole for electrically connecting the first wire and the overlap portion.

7. The circuit of claim 1, wherein the second wire is an hook-type wire.

8. The circuit of claim 1, wherein the first wire includes a first red wire connecting to a first red pixel, a first green wire connecting to a first green pixel, and a first blue wire connecting to a first blue pixel.

9. A circuit for use in a display, comprising:
   a substrate having an active area and a bonding area;
   at least one thin film transistor disposed on the substrate and in the active area;
   at least one first wire disposed on the substrate and in the bonding area;
   at least one second wire, each having:
      a first end electrically connected to the first wire; and
      a second end substantially located at an edge of the substrate; and
   at least one third wire, each having:
      a first end substantially located at the edge of the substrate; and
      an overlap portion overlapping the first wire.

10. The circuit for use in a display of claim 9, wherein the overlap portion is electrically insulated from the first wire.

11. The circuit for use in a display of claim 9, wherein the overlap portion is electrically connected to the first wire.

12. The circuit for use in a display of claim 9, further comprising an insulating layer disposed between the overlap portion and the first wire, wherein the insulating layer is comprised of silicon nitride, gate silicon nitride, amorphous silicon, or etching stopper silicon nitride.

13. The circuit for use in a display of claim 9, further comprising an insulating layer disposed between the overlap portion and the first wire, wherein the insulating layer has a contact hole for electrically connecting the first wire and the overlap portion.

14. The circuit for use in a display of claim 9, wherein the second wire is an hook-type wire.

\* \* \* \* \*